United States Patent
Hsu et al.

(10) Patent No.: US 6,878,642 B1
(45) Date of Patent: Apr. 12, 2005

(54) METHOD TO IMPROVE PASSIVATION OPENINGS BY REFLOW OF PHOTORESIST TO ELIMINATE TAPE RESIDUE

(75) Inventors: Hung-Jen Hsu, Chung-Ho (TW); Yu-Kung Hsiao, Tao-Yuan (TW); Chih-Kung Chang, Hsin-Chu (TW); Sheng-Liang Pan, Hsin-Chu (TW); Kuo-Liang Lu, Hsin-Chu (TW)

(73) Assignee: Taiwan Semiconductor Manufacturing Company, Hsin-Chu (TW)

( * ) Notice: Subject to any disclaimer, the term of this patent is extended or adjusted under 35 U.S.C. 154(b) by 0 days.

(21) Appl. No.: 09/679,514

(22) Filed: Oct. 6, 2000

(51) Int. Cl.⁷ ................................. H01L 21/31
(52) U.S. Cl. ........................ 438/759; 438/760
(58) Field of Search ................. 438/612, 613, 438/615, 714, 760, 734, 743, 428, 436, 438, 698, FOR 132, FOR 439, 759, 723

(56) References Cited

U.S. PATENT DOCUMENTS

| | | | |
|---|---|---|---|
| 4,908,683 A | * 3/1990 | Matlock et al. | 257/506 |
| 5,063,655 A | 11/1991 | Lamey et al. | 29/611 |
| 5,137,845 A | * 8/1992 | Lochon et al. | 148/DIG. 143 |
| 5,320,981 A | * 6/1994 | Blalock | 438/640 |
| 5,492,235 A | * 2/1996 | Crafts et al. | 216/100 |
| 5,731,243 A | 3/1998 | Peng et al. | 438/612 |
| 5,943,597 A | * 8/1999 | Kleffner et al. | 257/737 |
| 5,994,753 A | * 11/1999 | Nitta | 257/471 |
| 6,025,275 A | 2/2000 | Efland et al. | 438/722 |
| 6,060,378 A | 5/2000 | Rolfson | 438/612 |
| 6,228,775 B1 | * 5/2001 | Coburn et al. | 216/67 |

FOREIGN PATENT DOCUMENTS

| JP | 03038826 A | * 2/1991 | H01L/21/302 |
|---|---|---|---|
| JP | 05160019 A | * 6/1993 | H01L/21/027 |

* cited by examiner

*Primary Examiner*—George Fourson
*Assistant Examiner*—Brook Kebede

(57) ABSTRACT

A new method to form passivation openings in the manufacture of an integrated circuit device is achieved. The passivation openings have gradually sloping sidewalls that allow a protective tape to be completely removed without leaving adhesive residue. A semiconductor substrate is provided. A passivation layer is deposited. An organic photoresist layer is deposited overlying the passivation layer. The organic photoresist layer is patterned to expose the passivation layer in areas where passivation openings are planned. The organic photoresist layer is reflowed to create gradually sloping sidewalls on the organic photoresist layer. The passivation layer is etched through to from the passivation openings. The passivation openings are thereby formed with gradually sloping sidewalls. The organic photoresist layer is stripped away. A protective tape is applied overlying the passivation layer and the passivation openings. The protective tape is removed. The gradually sloping sidewalls on the passivation openings allow the protective tape to be completely removed without leaving adhesive residue in the manufacture of the integrated circuit device.

20 Claims, 6 Drawing Sheets

US 6,878,642 B1

METHOD TO IMPROVE PASSIVATION OPENINGS BY REFLOW OF PHOTORESIST TO ELIMINATE TAPE RESIDUE

BACKGROUND OF THE INVENTION (1) Field of the Invention

The invention relates to a method of fabricating semiconductor structures, and more particularly, to a method of forming passivation openings by reflow of photoresist to eliminate protective tape residue in the manufacture of an integrated circuit device.

(2) Description of the Prior Art

Ultra Large-Scale Integration (ULSI) devices are assembled into integrated circuit packages using a sequence of processes that occur after the circuit wafers have completed the topside processing. This secondary sequence of processes is typically called the assembly process, or the back-end process of the manufacturing plant.

An important step in the assembly process is a step called backside grind. Large diameter wafers, common in modern ULSI technologies, must be made substantially thick to withstand the rigors of the topside, or device side, processing without breaking. However, the completed circuit die often need to be thinner to facilitate heat transfer and to correct for thermal mismatch in the packaged part. In addition, thick wafers place more demands on the dicing process wherein the wafers are sawed into individual chips. It is therefore necessary to reduce the thickness of the wafers after the topside processing is completed.

The backside grinding process is used to thin the wafers. In the backside grinding process, the wafers are first covered with a protective tape. Then the wafers are positioned, topside down, on a grinding chuck. Material is removed from the backside of the wafer using a grinding process.

Referring now to FIG. 1, a top view of an integrated circuit die 10 is shown. This integrated circuit die 10 comprises one of hundreds or thousands of such circuits on an integrated circuit wafer. Note that a series of bonding pads 14 ring the perimeter of the die 10. These bonding pads are openings in the passivation layer that overlies the surface of the die 10. Each bonding pad 14 represents a location where the integrated circuit package will contact the die using, for example, a wire bond.

Referring now to FIG. 2, a cross section of a bonding pad is shown. The semiconductor substrate 20 is shown as a homogeneous layer for simplicity of illustration. However, in practice, the semiconductor substrate 20 would comprise several layers to create the devices of the circuit. A metal layer 24 overlies the semiconductor substrate 20. A passivation layer 28 overlies the metal layer 24 to electrically isolate and protect the metal layer 24 and the semiconductor substrate 20 from the integrated circuit package.

The bonding pad opening is formed in the passivation layer 28 using a conventional photolithographic sequence. A photoresist layer 32 is first deposited overlying the passivation layer 28. The photoresist layer 32 is exposed and developed to thereby expose the passivation layer 28 in the areas overlying the metal layer 24 where the bonding pads are planned. The passivation layer 28 is etched through to form the bonding pads. Sharp edges 36 are formed in the passivation layer 28.

Referring now to FIG. 3, after the topside processing is complete, the topside of integrated circuit wafer is covered with a protected tape 40 and 44. The protective tape 40 and 44 is typically a laminate material comprising an adhesive film 40 and a tape layer 44. The tape layer 44 protects the wafer from damage during the backside grinding operation.

Referring now to FIG. 4, after the backside grinding operation has thinned the semiconductor substrate 20, the tape layer 44 is removed. A problem in the method of the prior art is then illustrated. The relatively sharp edges of the bonding pad opening can sheer away a portion of the adhesive film and cause an adhesive residue 48 to remain after the protective tape is removed. This adhesive residue 48 can cause wire bonding problems that reduce reliability and product yield.

Referring now to FIG. 5, one prior art solution to this problem is to create a stair step profile 52 on the bonding pad opening. In this method, a two-step etching process is used whereby an undercut of the passivation layer 28 is achieved. However, this method is not effective in preventing tape adhesive residue when the bonding pad number exceeds 35,000. In addition, two etch machines and additional cycle time are required to create the stair-step profile.

Several prior art inventions describe methods to prevent adhesive residue, to form bonding pads, or to reflow photoresist. U.S. Pat. No. 5,731,243 to Peng et al teaches a method to reduce protective tape adhesive contamination. The photoresist layer used to define the bonding pad openings is removed after the pad etch. A special cleaning step is added to remove any residual polymer. The inclusion of the special cleaning step reduces adhesive residue after the protective tape is removed. U.S. Pat. No. 6,060,378 to Rolfson discloses a method to form bonding pads with improved reliability. The passivation layer is etched to create pad openings. U.S. Pat. No. 6,025,275 to Efland et al discloses a method to form thick plated copper interconnects. A photoresist with a reflow step is used between the etch of the bondable metal layer and etch of the seed layer. By reflowing the photoresist layer, the sidewalls of the bondable metal layer are covered and protected from undercutting during the seed layer etch. U.S. Pat. No. 5,063,655 to Lamey et al teaches a method to integrate the driver pulse circuitry and the resistors of an ink jet printer onto the printer head. A photoresist with reflow step is used to create a gradually sloping contact opening. The sloping contact is used to connect the metal layer and the resistor layer and prevents cracking of the metal layer.

SUMMARY OF THE INVENTION

A principal object of the present invention is to provide an effective and very manufacturable method to form openings in the passivation layer of an integrated circuit device.

A further object of the present invention is to form the openings in the passivation layer with gradually sloping sidewalls to thereby allow the protective tape to be removed from the integrated circuit wafer without leaving adhesive residue.

A yet further object of the present invention is to form the gradually sloping sidewalls on the passivation openings through the use of a photoresist reflow step.

In accordance with the objects of this invention, a new method to form passivation openings in the manufacture of an integrated circuit device is achieved. The passivation openings have gradually sloping sidewalls that allow a protective tape to be completely removed without leaving adhesive residue. A semiconductor substrate is provided. The semiconductor substrate may comprise levels and devices that make up the circuit. A passivation layer is deposited overlying the semiconductor substrate. An organic photoresist layer is deposited overlying the passivation layer. The organic photoresist layer is patterned to expose the passivation layer in areas where passivation openings are planned. The organic photoresist layer is reflowed to create gradually sloping sidewalls on the organic photoresist layer. The passivation layer is etched through to form the passivation openings. The passivation openings are thereby formed with gradually sloping sidewalls. The organic photoresist layer is stripped away. A protective tape is applied overlying the passivation layer and the passivation openings. The protective tape is removed. The gradually sloping sidewalls on the passivation openings allow the protective tape to be completely removed without leaving adhesive residue in the manufacture of the integrated circuit device.

BRIEF DESCRIPTION OF THE DRAWINGS

In the accompanying drawings forming a material part of this description, there is shown.

DESCRIPTION OF THE PREFERRED EMBODIMENTS

The preferred embodiment discloses the application of the method of the present invention to the formation of bonding pad openings through the passivation layer of an integrated circuit device. It should be clear to those experienced in the art that the present invention can be applied and extended without deviating from the scope of the present invention.

Figure 1:
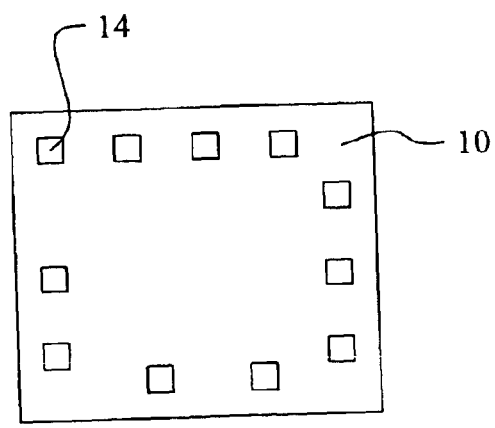
FIG. 1 illustrates a top view of an integrated circuit device die.
Figure 2:
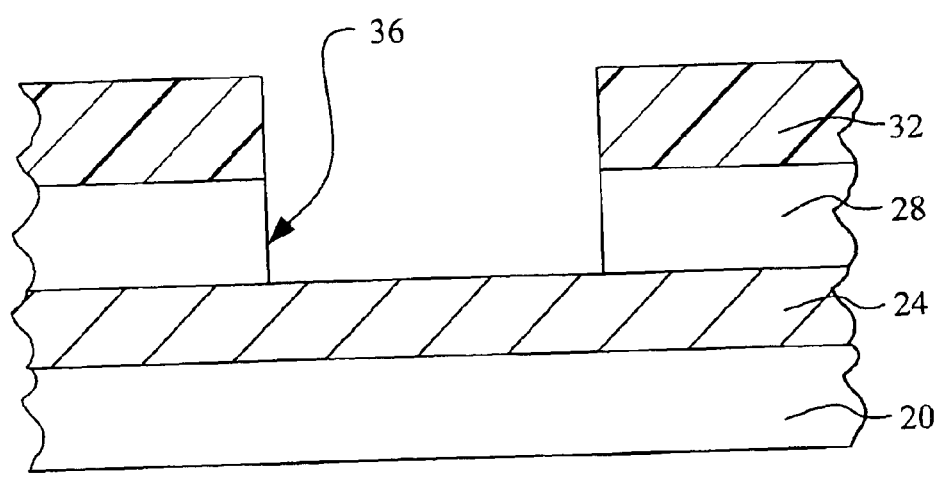
FIGS. 2 through 5 illustrate in cross section the prior art methods to form bonding pad openings in a passivation layer and the protective tape adhesive residue problem.
Figure 3:
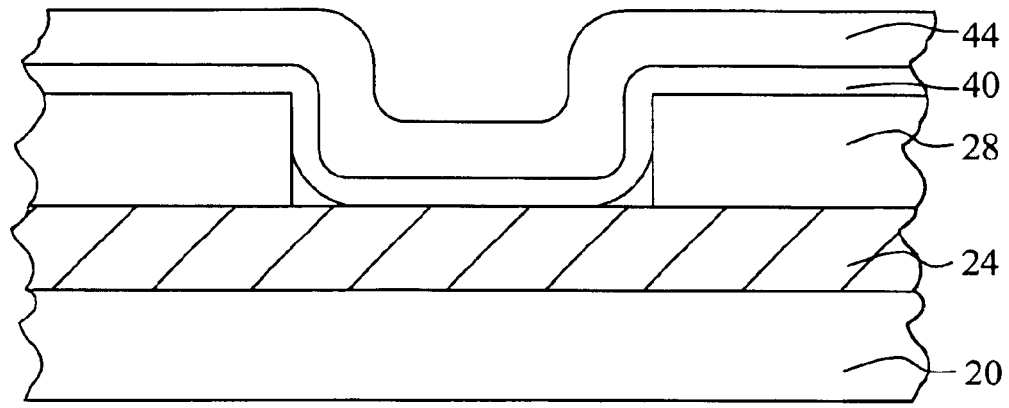
Figure 4:
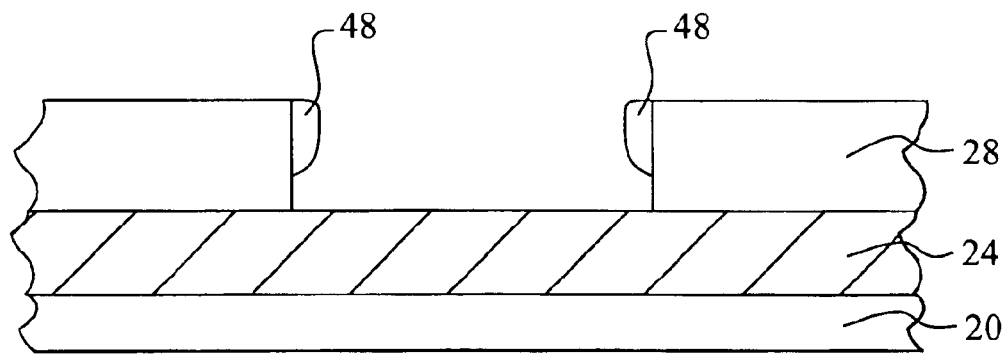
Figure 5:
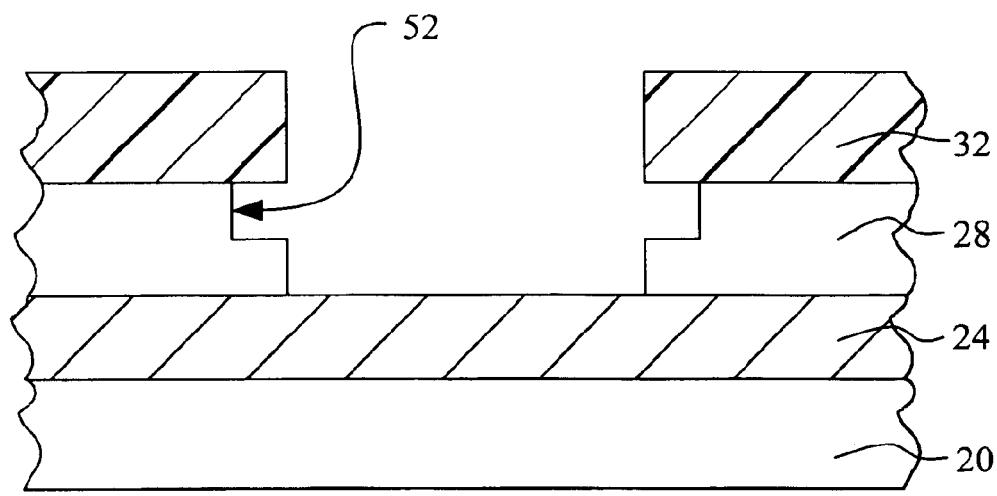
Figure 6:
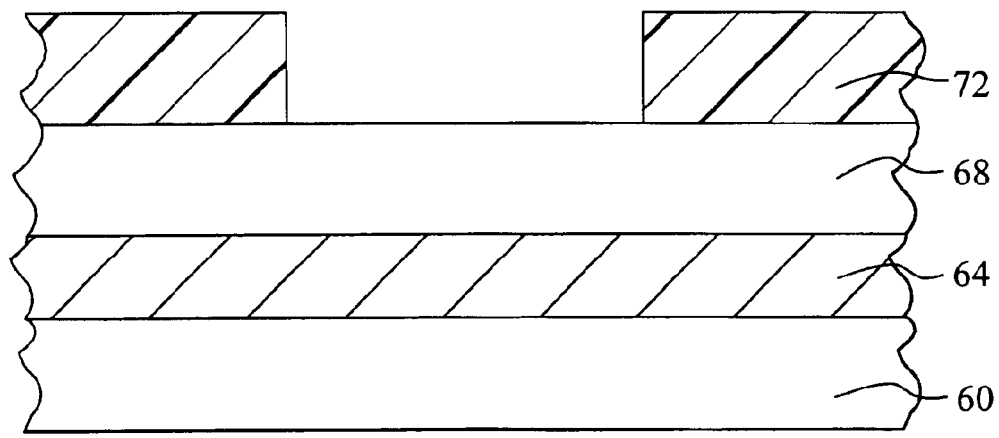
FIGS. 6 through 11 illustrate in cross section the preferred embodiment of the present invention.

Referring now particularly to FIG. 6, there is shown a cross section of a partially completed integrated circuit device. A semiconductor substrate 60 is provided. To simplify the illustration, the substrate 60 is shown as a homogeneous entity. In practice, the substrate 60 will comprise a preponderance of devices, layers, interconnects, and isolations that make up the circuit. The substrate 60 is shared between many individual circuit die on the semiconductor wafer.

A metal layer 64 is provided overlying the semiconductor substrate 60. This metal layer 64 is the final metal layer formed on the integrated circuit prior to the deposition of the passivation layer 68. For simplicity of illustration, the metal layer 64 is shown as a contiguous layer. In practice, the metal layer 64 may be patterned to form individual connective lines overlying the substrate 60. Alternatively, there may be no top metal layer in a section of the circuit. In this case, the method of the present invention is still applicable.

A passivation layer 68 is deposited overlying the metal layer 64. The passivation layer 68 serves as an electrical, structural, oxidation, and contamination barrier overlying the integrated circuit device. The passivation layer 68 preferably comprises silicon nitride that may be deposited by low-pressure chemical vapor deposition (LPCVD) which may be plasma assisted. The passivation layer 68 is deposited to a thickness of between about 3,000 Angstroms and 15,000 Angstroms.

In this case, a bonding pad opening is to be formed through the passivation layer 68 to the underlying metal layer 64 so that a wire bond may be fabricated to connect the metal layer 64 signal to the package pin. An organic photoresist layer 72 is therefore deposited overlying the passivation layer 68. The organic photoresist layer 72 comprises a material that can be reflowed at an elevated temperature after exposure and development. The organic photoresist layer 72, may comprise any of several materials such as JSR-7980G, AZ-6130, SPR-219, or 8900D2B3 manufactured by various manufacturers. The organic photoresist layer 72 is deposited preferably by spin coating to a thickness of between about 10,000 Angstroms and 50,000 Angstroms. After a conventional bake, the organic photoresist layer 72 is exposed to actinic light through a photolithographic mask. The organic photoresist layer 72 is then developed. This causes the removal of the unexposed photoresist and thereby exposes the underlying passivation layer 68 where the bonding pad openings are planned.

Figure 7:
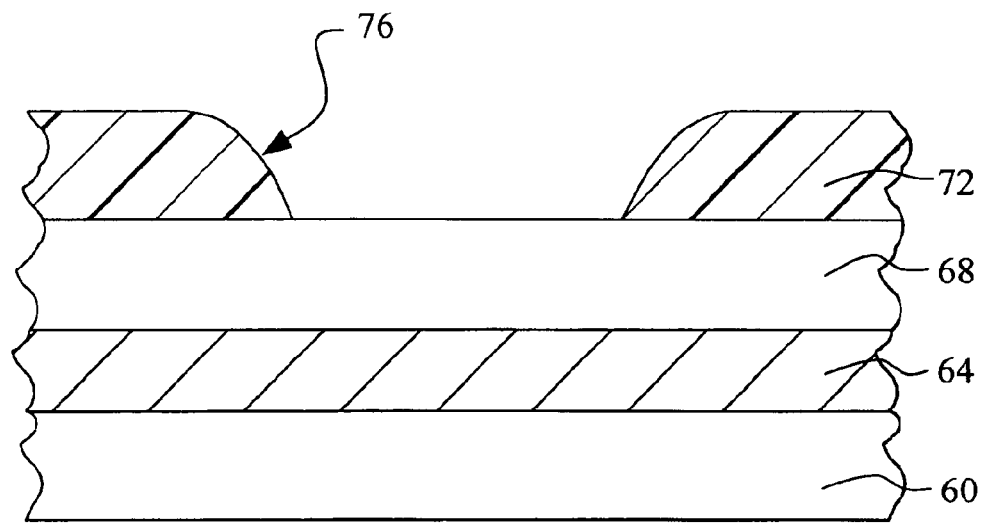

Referring now to FIG. 7, a novel and important step in the method of the present invention is illustrated. The organic photoresist layer 72 is now subjected to a reflow process. In the reflow process, the organic photoresist layer 72 is heated above its material glass transition temperature ($T_g$). At this temperature, the organic photoresist layer 72, which is normally hard and nonplastic after exposure to light, becomes plastic. The photoresist 72 exhibits a reflow response. The cohesive force, which had formed the near vertical sidewalls of FIG. 6, is reduced by the increase in energy in the photoresist polymer structure due to the increased temperature. The profile edge is thereby relaxed and gradually sloping sidewalls 76 are produced in the organic photoresist layer 72. These sidewalls, which may be described as a tilted profile, do not contain the sharp edges found in the FIG. 6.

The reflow process preferably comprises heating the semiconductor wafer to a temperature of between about 140 degrees C. and 200 degrees C. for between about 3 minutes and 15 minutes. A baking regime of between about 160 degrees C. and 180 degrees C. for about 10 minutes is most preferred.

Figure 8:
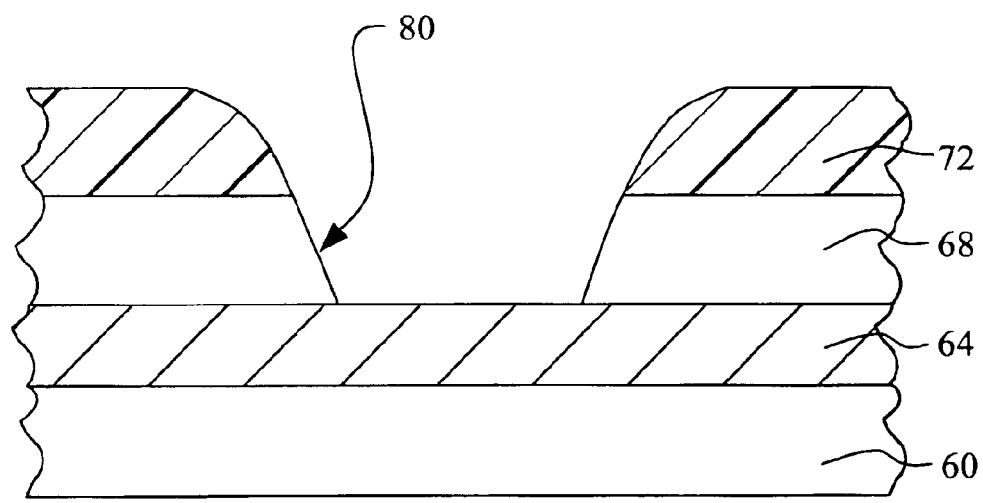

Referring now to FIG. 8, another important feature of the present invention is illustrated. The passivation layer 68 is etched through where exposed by the organic photoresist layer 72. The presence of the gradually sloping sidewalls that define the etching mask causes the passivation etching profile to likewise take a gradually sloping profile 80. The passivation layer 68 dry plasma etching process uses an etching chemistry preferably comprising $CF_4$ and $O_2$ gases.

Figure 9:
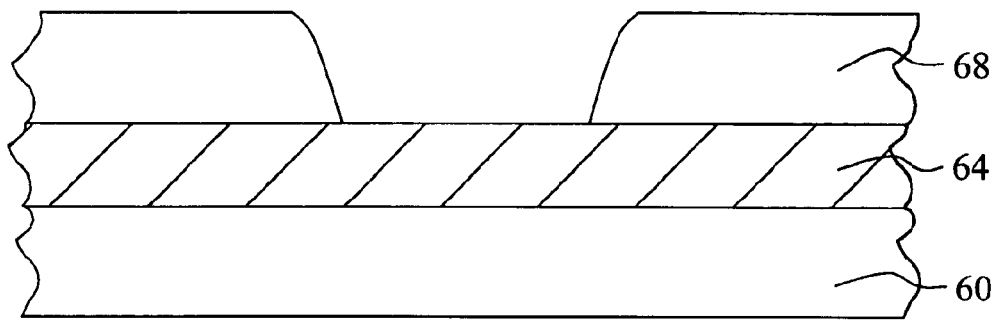

Referring now to FIG. 9, the remaining organic photoresist layer 72 is stripped away. The bonding pad opening is thereby completed. The organic photoresist layer 72 is preferably stripped away using an oxygen plasma strip process well known in the art. The topside, or device side, of the circuit is completed by the deposition and patterning of the passivation layer 68.

Figure 10:
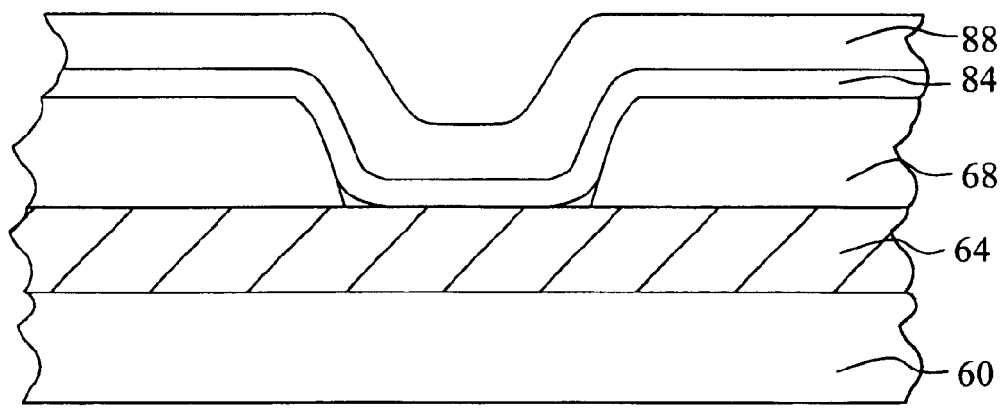

Referring now to FIG. 10, the semiconductor wafer is prepared for the backside grinding operation described in the prior art analysis above. A protective tape 84 and 88 is applied to the topside of the semiconductor wafer overlying the passivation layer 68 and the bonding pad openings. The protective tape is a laminate material comprising a tape layer 88 overlying an adhesive layer 84. The adhesive layer 84 keeps the tape layer 88 in place during handling. The tape layer 88 protects the topside of the circuit from damage. The adhesive strength of the protective tape 84 and 88 is an important factor in tape performance. After application of the protective tape 84 and 88, the semiconductor wafer is subjected to the backside grinding operation to thin the substrate to the desired thickness.

Figure 11:
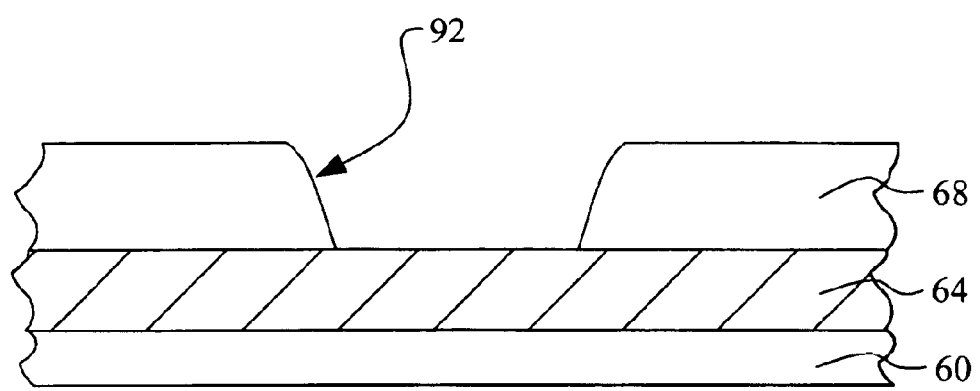

Referring now to FIG. 11, the semiconductor substrate 60 has been thinned by the backside grinding operation. The protective tape 84 and 88 is then removed. Preferably, the protective tape is removed using a peeling tape. A peeling tape, not shown, is applied overlying the protective tape 84 and 88. The peeling tape has a higher adhesive strength than the protective tape. When the peeling tape is pulled away from the wafer, the protective tape also is pulled away.

Note that the novel, gradually sloping edges 92 of the passivation layer 68 in the bonding pad opening allows the protective tape 84 and 88 to be completely removed without leaving any of the adhesive layer 84. No adhesive residue is left in the bonding pad opening. This facilitates improved wire bonding quality and reliability as well as improved device yield.

As shown in the preferred embodiments, the present invention provides a very manufacturable and effective method to eliminate protective tape adhesive residue in bonding pads. By subjecting the patterned photoresist layer to a reflow bake, gradually sloping photoresist edges are formed. This profile is then transferred into the passivation layer in the etching process. The gradually sloping profile of the bonding pad openings in the passivation layer allows the protective tape to be completely removed without leaving any adhesive residue. The method provides this advantage without an additional etching step.

While the invention has been particularly shown and described with reference to the preferred embodiments thereof, it will be understood by those skilled in the art that various changes in form and details may be made without departing from the spirit and scope of the invention.

What is claimed is:

1. A method to form passivation openings that prevent protective tape residue in the manufacture of an integrated circuit device comprising:

providing a semiconductor substrate;
   depositing a passivation layer overlying said semiconductor substrate;
   depositing an organic photoresist layer overlying said passivation layer;
   patterning said organic photoresist layer to expos said passivation layer in areas where said passivation openings are planned;
   reflowing said organic photoresist layer to create gradually sloping sidewalls on said organic photoresist layer;
   thereafter etching through said passivation layer not covered by organic photoresist layer to form said passivation openings with gradually sloping sidewalls wherein said etching does not etch said organic photoresist layer;
   stripping away said organic photoresist layer;
   applying a protective tape overlying said passivation layer and said passivation openings; and
   removing said protective tape wherein said gradually sloping sidewalls on said passivation openings allow said protective tape to be completely removed without leaving adhesive residue in the manufacture of the integrated circuit device.

2. The method according to claim 1 wherein said passivation layer comprise silicon nitride.

3. The method according to claim 1 wherein said passivation layer is deposited to a thickness of between about 3,000 Angstroms and 15,000 Angstroms.

4. The method according to claim 1 wherein said organic photoresist layer is deposited to a thickness of between about 10,000 Angstroms and 50,000 Angstroms.

5. The method according to claim 1 wherein said step of reflowing said organic photoresist layer is performed at a temperature of between about 140 degrees C. and 200 degrees C. for a duration of between about 3 minutes and 15 minutes.

6. The method according to claim 1 wherein said step of etching through said passivation layer comprises a dry plasma etching process using an etching chemistry comprising $CF_4$ and $O_2$ gases.

7. The method according to claim 1 wherein said step of removing said protective tape is by use of a peeling tape.

8. The method according to claim 1 further comprising grinding the backside of said semiconductor substrate after said step of applying said protective tape and prior to said step of removing said protective tape.

9. A method to form bonding pad openings that prevent tape residue in the manufacture of an integrated circuit device comprising:

providing a semiconductor substrate;
   depositing a passivation layer overlying said semiconductor substrate;
   depositing an organic photoresist layer overlying said passivation layer;
   patterning said organic photoresist layer to expose said passivation layer in areas where passivation openings are planned;
   reflowing said organic photoresist layer to create gradually sloping sidewalls on said organic photoresist layer wherein said reflowing is performed at a temperature of between 140 degrees C. and 210 degrees C. for a duration of between 3 minutes and 15 minutes;
   etching through said passivation layer not covered by said organic photoresist layer to form said passivation openings with gradually sloping sidewalls;
   stripping away said organic photoresist layer;
   applying a protective tape overlying said passivation layer and said passivation openings; and
   removing said protective tape wherein said gradually sloping sidewalls on said passivation openings allow the protective tape to be completely removed without leaving adhesive residue.

10. The method according to claim 9 wherein said passivation layer comprises silicon nitride.

11. The method according to claim 9 wherein said passivation layer is deposited to a thickness of between about 3,000 Angstroms and 15,000 Angstroms.

12. The method according to claim 9 wherein said organic photoresist layer is deposited to a thickness of between about 10,000 Angstroms and 50,000 Angstroms.

13. The method according to claim 9 wherein said step of removing said protective tape is by use of a peeling tape.

14. The method according to claim 9 wherein said step of etching through said passivation layer comprises a dry plasma etching process using an etching chemistry comprising $CF_4$ and $O_2$ gases.

15. The method according to claim 9 further comprising grinding the backside of said semiconductor substrate after said step of applying said protective tape and prior to said step of removing said protective tape.

16. A method to form bonding pad openings that prevent tape residue in the manufacture of an integrated circuit device comprising:

providing a semiconductor substrate;
   providing a metal layer overlying said semiconductor substrate;

depositing a passivation layer overlying said metal layer;

depositing an organic photoresist layer overlying said passivation layer;

patterning said organic photoresist layer to expose said passivation layer in areas overlying said metal layer where said bonding pad openings are planned;

reflowing said organic photoresist layer to create gradually sloping sidewalls on said organic photoresist layer wherein said reflowing is performed at a temperature of between 140 degrees C. and 200 degrees C. for a duration of between 3 minutes and 15 minutes;

etching through said passivation layer not covered by said passivation layer to form said bond pad openings with gradually sloping sidewalls;

stripping away said organic photoresist layer;

applying a protective tape overlying said passivation layer and said bond pad openings; and removing said protective tape wherein said gradually sloping sidewalls on said passivation openings allow the protective tape to be completely removed without leaving adhesive residue and wherein said removing is by use of a peeling tape in the manufacture of the integrated circuit device.

17. The method according to claim 16 wherein said passivation layer is deposited to a thickness of between about 3,000 Angstroms and 15,000 Angstroms.

18. The method according to claim 16 wherein said organic photoresist layer is deposited to a thickness or between about 10,000 Angstroms and 50,000 Angstroms.

19. The method according to claim 15 further comprising grinding the backside of said semiconductor substrate after said step of applying a protective tape and prior to said step of removing said protective tape.

20. The method according to claim 16 wherein said step of etching through said passivation layer comprises a dry plasma etching process using an etching chemistry comprising $CF_4$ and $O_2$ gases.

* * * * *